ns>

United States Patent [19]
Yeap et al.

[11] Patent Number: 6,093,594
[45] Date of Patent: Jul. 25, 2000

[54] CMOS OPTIMIZATION METHOD UTILIZING SACRIFICIAL SIDEWALL SPACER

[75] Inventors: Geoffrey Choh-Fei Yeap, Sunnyvale; Qi Xiang, Santa Clara; Ming-Ren Lin, Cupertino, all of Calif.

[73] Assignee: Advanced Micro Devices, Inc., Sunnyvale, Calif.

[21] Appl. No.: 09/069,879

[22] Filed: Apr. 29, 1998

[51] Int. Cl.[7] ................................................ H01L 21/8238
[52] U.S. Cl. ........................ 438/231; 438/303; 257/392
[58] Field of Search .................... 438/231, 199, 438/731, 303, FOR 185, FOR 187, FOR 188, FOR 199; 257/344, 369, 347, 408

[56] References Cited

U.S. PATENT DOCUMENTS

| | | | |
|---|---|---|---|
| 5,766,991 | 6/1998 | Chen | 438/231 |
| 5,869,866 | 2/1999 | Fulford, Jr. et al. | 257/347 |
| 5,920,104 | 7/1999 | Nayak et al. | 257/408 |
| 5,952,693 | 9/1999 | Wu | 257/344 |

*Primary Examiner*—Olik Chaudhuri
*Assistant Examiner*—William David Coleman
*Attorney, Agent, or Firm*—Mikio Ishimaru

[57] ABSTRACT

An ultra-large scale CMOS integrated circuit semiconductor device is processed after the formation of the gates and gate oxides by N-type dopant implantation to form N-type shallow source and drain extension junctions. Spacers are formed for N-type dopant implantation to form N-type deep source and drain junctions. A higher temperature rapid thermal anneal then optimizes the NMOS source and drain extension junctions and junctions, and the spacers are removed. A thin oxide spacer is used to displace P-type dopant implantation to P-type shallow source and drain extension junctions. A nitride spacer is then formed for P-type dopant implantation to form P-type deep source and drain junctions. A second lower temperature rapid thermal anneal then independently optimizes the PMOS source and drain junctions independently from the NMOS source and drain junctions.

20 Claims, 5 Drawing Sheets

CMOS OPTIMIZATION METHOD UTILIZING SACRIFICIAL SIDEWALL SPACER

TECHNICAL FIELD

The present invention relates generally to manufacturing semiconductors and more specifically to a manufacturing method deep-submicron Complementary Metal-Oxide Semiconductors (CMOS).

BACKGROUND ART

Complementary Metal-Oxide-Semiconductor (CMOS) is the primary technology for ultra large-scale integrated (ULSI) circuits. These ULSI circuits combine both P-channel Metal-Oxide-Semiconductor (PMOS) devices and N-channel Metal-Oxide-Semiconductor (NMOS) devices on the same integrated circuit.

To gain performance advantages, scaling down the size of CMOS devices has been the principal focus of the microelectronics industry over the last two decades. Unfortunately, it has not been possible to obtain maximum performance advantage of scaling because both the NMOS and PMOS devices can not be individually optimized.

In the past, the conventional process involved doping a silicon substrate and growing a gate oxide on the substrate followed by a deposition of polysilicon. A photolithographic process was used to etch the polysilicon to form the device gate. This could be followed by a polysilicon reoxidation or not depending on the process. As device sizes were scaled down, the source and drain junctions had to scale down. As the source and drain junctions are scaled down, series resistance increases, which degrades the device performance. To reduce series resistance, advanced CMOS devices have to have junction structures that include relatively deep source and drain junctions to improve series resistance and very shallow source and drain extension junctions to permit the scale down. The difficulties of controlling the displacements of these structures become apparent from the following process described below which is used after the formation of the polysilicon gate.

For a "single spacer" process, an N-type dopant would be implanted to form the shallow source/drain extension junctions of the n-channel devices followed by a P-type dopant to form the deep source/drain extension junctions of the p-channel devices. The single oxide or oxynitride spacers then would be formed. With the N-type dopant source/drain extension junctions protected by the single spacers, the N-type dopant would be more deeply implanted to in the n-channel device region to form the deep source/drain junctions. There would then be a first rapid thermal anneal (RTA) for the N-type dopant source/drain junctions. With the P-type dopant source/drain extension junctions also protected by the single spacer, the P-type dopant would be more deeply implanted to in the p-channel device region to form the deep source/drain junctions. There would then be a second rapid thermal anneal (RTA) for the P-type dopant source/drain junctions.

For a "double spacer" process, an N-type dopant would be implanted to form the shallow source/drain extension junctions of the n-channel devices. The first spacer would then be formed. With the N-type dopant source/drain extension junctions protected by the first spacer, the N-type dopant would be more deeply implanted to in the n-channel device region to form the deep source/drain junctions. There would then be a first RTA for the N-type dopant source/drain junctions. The first RTA is followed by a P-type dopant to form the shallow source/drain extension junctions of the p-channel devices. The second spacer then would be formed. With the P-type dopant source/drain extension junctions protected by the first and second spacers, the P-type dopant would be more deeply implanted to in the p-channel device region to form the deep source/drain junctions. There would then be a second RTA for the P-type dopant source/drain junctions.

In the single spacer process, both types of devices can not be optimized because the P-type source/drain extension junction implantations are followed by the first and second RTA's. The transient enhanced diffusion caused by the two RTA's inherently increases the displacement of the shallow P-type source/drain extension junctions and degrades the performance of the p-channel devices.

In the double spacer process, both types of devices can not be optimized because the first spacer controls the displacements of both the deep N-type dopant source/drain junctions and the shallow P-type dopant source/drain extension junctions.

It has long been known that the inability to optimize devices would lead to detrimental compromises in performance so optimization process improvements have been long sought but have eluded those skilled in the art. Similarly, it has long been known that the problems would become more severe with the reductions in device size to deep sub-micron levels.

DISCLOSURE OF THE INVENTION

The present invention provides a method of manufacturing an ultra-large scale CMOS integrated circuit semiconductor device by N-type dopant implantation to form shallow source and drain extension junctions. The implantation is followed by formation of spacers to shield the extension junctions during implantation of N-type deep source and drain junctions. A higher temperature rapid thermal anneal then optimizes the NMOS source and drain structures, and the spacers are removed. The aforegoing is repeated along with a lower temperature rapid thermal anneal to independently optimize the PMOS source and drain structures. During each implantation, photoresist masks are used to shield areas which are not intended to be implanted during the implantation.

The present invention provides a method of manufacturing semiconductors having different dopant source and drain structures which can be independently optimized.

The present invention further provides a method of manufacturing semiconductors having different dopant source and drain junctions which can be independently optimized.

The present invention still further provides a method of manufacturing semiconductors having different dopant source and drain extension junctions which can be independently optimized.

The present invention also provides a method of manufacturing semiconductors having N-type and P-type dopant source and drain structures which can be independently optimized.

The present invention additionally provides a method of manufacturing semiconductors having N-type and P-type dopant source and drain junctions which can be independently optimized.

The present invention even further provides a method of manufacturing semiconductors having N-type and P-type dopant source and drain extension junctions which can be independently optimized.

BEST MODE FOR CARRYING OUT THE INVENTION

Figure 1:
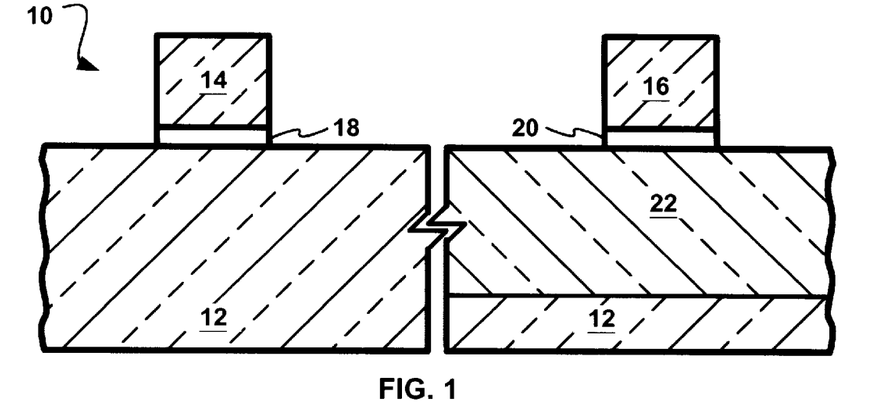
FIG. 1 is a cross-section of a semiconductor in an intermediate stage of processing.

Referring now to FIG. 1, therein is shown a cross-section of a semiconductor 10 in an intermediate stage of processing. At this stage are shown a silicon substrate 12 doped with a P-type dopant which is one of the Group III elements such as boron, aluminum, and gallium are used, with boron (B) or boron difluoride ($BF_2$) being the most commonly used. The semiconductor 10 is shown split to show two spaced polysilicon gates 14 and 16 side by side. The gates 14 and 16 are disposed over gate oxides 18 and 20, respectively. The gate oxide 20 is further disposed over an implanted N-well region 22 in the substrate 12 which has been doped with a N-type dopant which is one of the Group V elements such as phosphorus, arsenic, and antimony with phosphorous being the most commonly used.

It should be noted that the term "region" is used herein and applies to areas subject to implantation since there is a tapering decrease or increase of atoms of a given dopant in the region designated rather than a sharp demarcation as apparently indicated by the lines shown. Further, it should be noted that "source" and "drain" may be used interchangeably since they are the same for all purposes until connected in a circuit.

Figure 2:
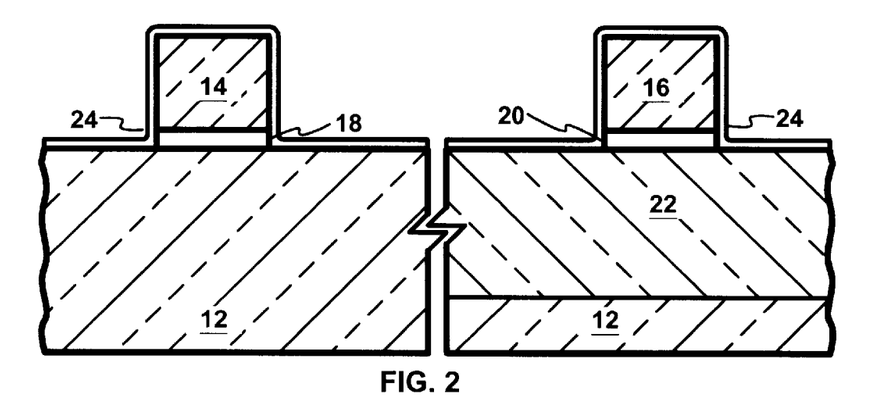
FIG. 2 is the cross-section of FIG. 1 with a first very thin oxide layer formed on it.

Referring now to FIG. 2, therein is shown a very thin oxide 24 formed by a reoxidation step as a very thin layer over the substrate 10, the polysilicon gates 14 and 16, and the gate oxides 18 and 20. A polysilicon reoxidation to further protect the surface is optional.

Figure 3:
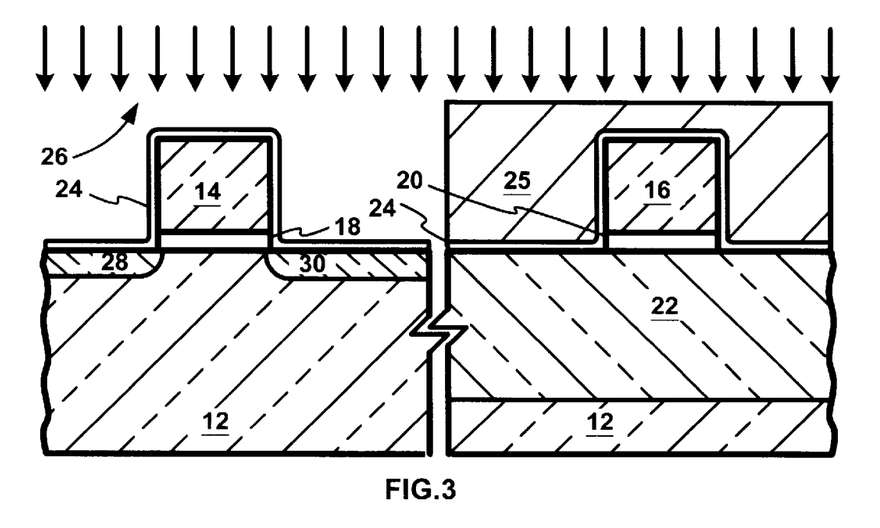
FIG. 3 is the cross-section of FIG. 2 during N-type dopant extension junction implantation.

Referring now to FIG. 3, therein is shown the ion implantation 26 of an N-type dopant through the very thin oxide 24 to form the N-type doped, shallow source and drain extension junctions 28 and 30. A conventional photolithographic masking process using a photoresist 25 is used to prevent ion implantation 26 of the N-well region 22, and is then removed.

Figure 4:
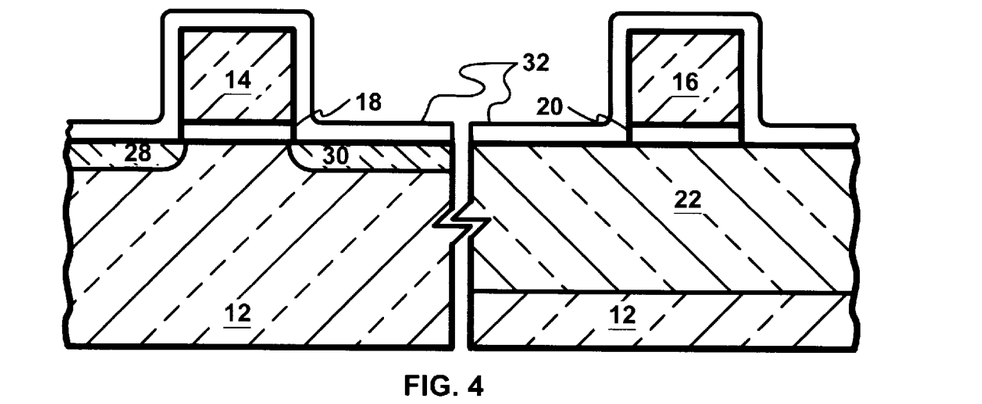
FIG. 4 is the cross-section of FIG. 3 with a first thin spacer formed on it.

Referring now to FIG. 4, therein is shown a first thin spacer 32 formed over the substrate 10, the polysilicon gates 14 and 16, and the gate oxides 18 and 20.

Figure 5:
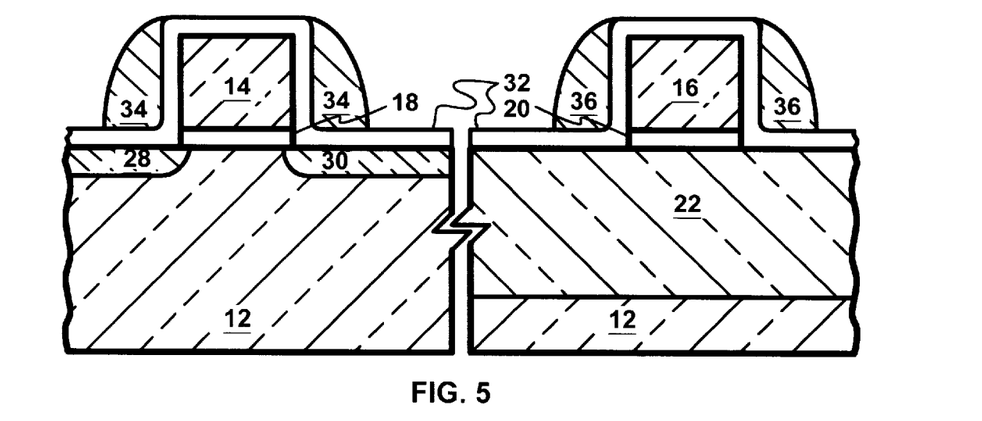
FIG. 5 is the cross-section of FIG. 4 with a first sidewall spacer formed on it.

Referring now to FIG. 5, therein is shown first sidewall spacers 34 and 36 formed over the first thin spacer 32 and around the polysilicon gates 14 and 16. It should be noted that the composition of the first thin spacer 32 and the first sidewall spacers 34 and 36 is different. If one is an oxide spacer, the other will be a nitride spacer and vice versa.

Figure 6:
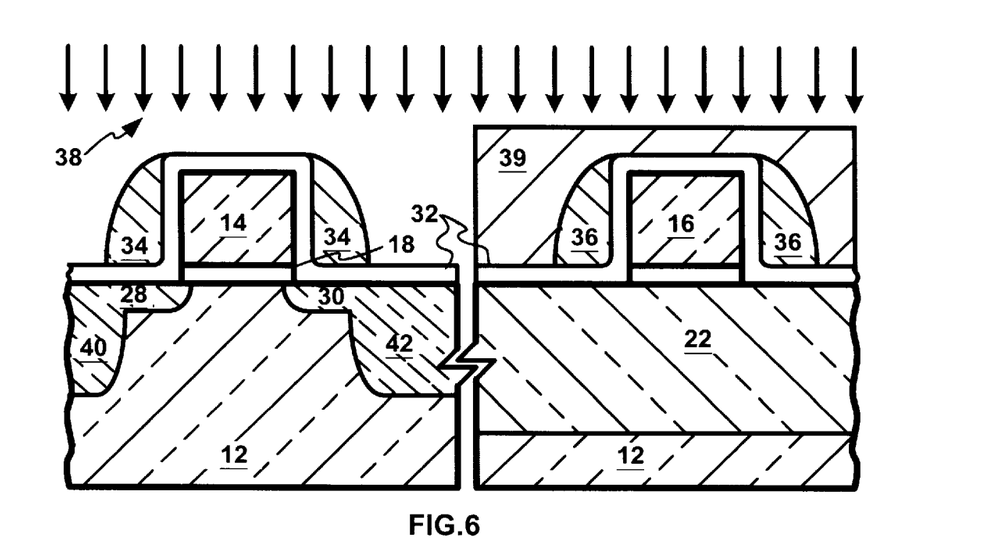
FIG. 6 is the cross-section of FIG. 5 during N-type dopant junction implantation.

Referring now to FIG. 6, therein is shown the ion implantation 38 of N-type dopant through the first thin spacer 32 to form the N-type doped, deep source and drain junctions 40 and 42. The first sidewall spacer 34 shields the shallow source and drain extension junctions 28 and 30 from the ion implantation 38. Again, a conventional photolithographic masking process is used to prevent ion implantation 38 of the N-well region 22. Here a photoresist 39 is used and then is removed.

Figure 7:
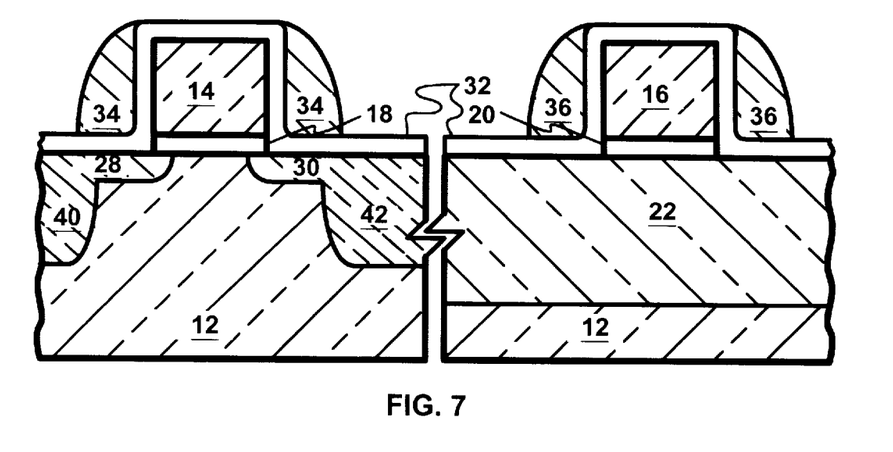
FIG. 7 is the cross-section of FIG. 6 during NMOS device rapid thermal anneal.

Referring now to FIG. 7, therein is shown the rapid thermal anneal of the N-type doped, deep source and drain junctions 40 and 42.

Figure 8:
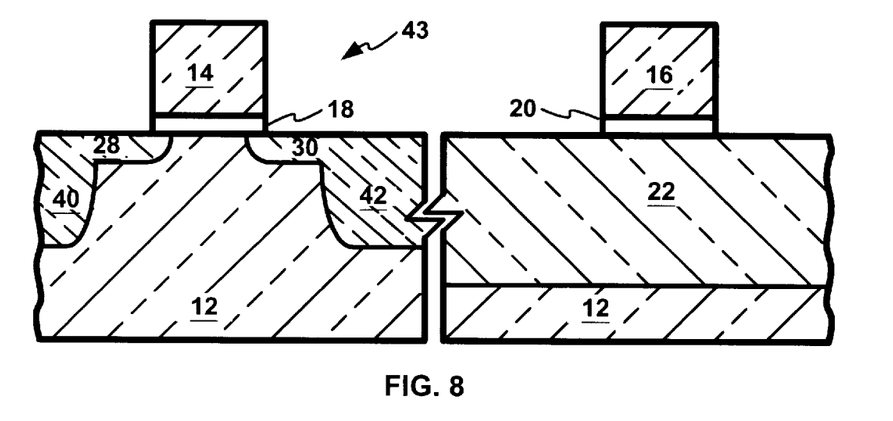
FIG. 8 is the cross-section of FIG. 7 after spacer removal.

Referring now to FIG. 8, therein is shown the removal of the first sidewall spacers 34 and 36 followed by the removal of the first thin spacer 32 to form the partially completed NMOS device 43.

Figure 9:
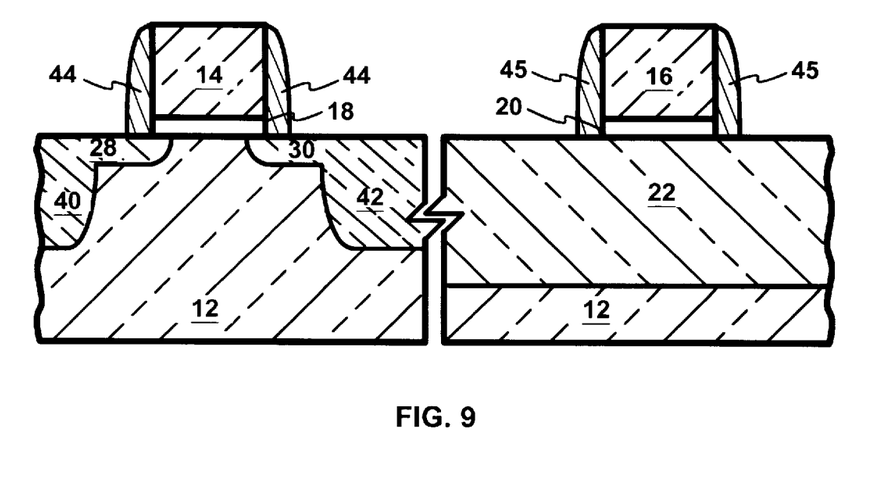
FIG. 9 is the cross-section of FIG. 8 with a second very thin spacer formed on it.

Referring now to FIG. 9, therein are shown thin sidewall spacers 44 and 45 formed around the polysilicon gates 14 and 16, respectively. The thin sidewall spacers 44 and 45 are preferably oxide spacers rather than nitride since oxide has a lower dielectric constant. Since the thin sidewall spacers 44 and 45 will remain in place in the finished devices, the lower dielectric constant means that the overlap capacitance, the capacitance around the sides of the oxide spacers 18 and 20, would be smaller and the device performance would be enhanced.

Figure 10:
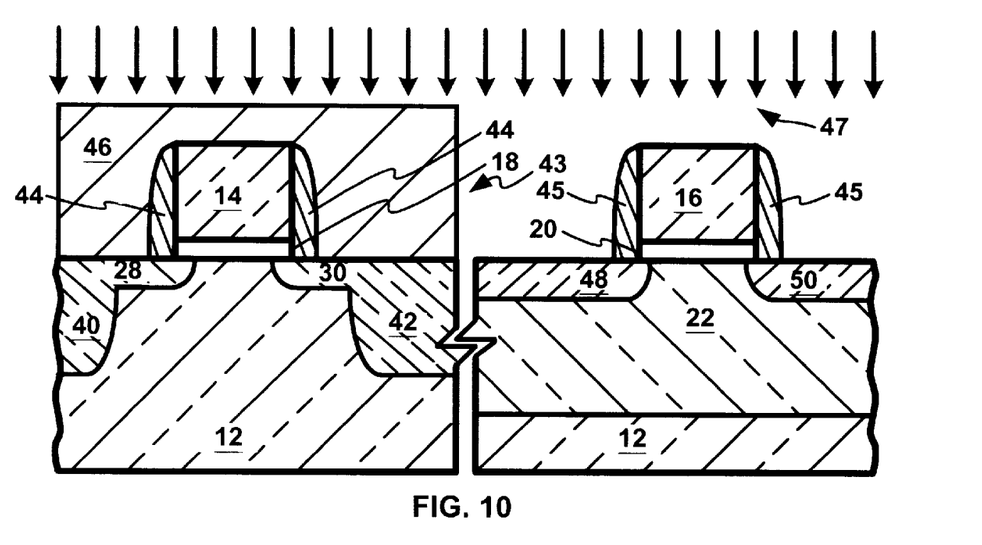
FIG. 10 is the cross-section of FIG. 9 during P-type dopant extension junction implantation.

Referring now to FIG. 10, therein is shown the ion implantation 47 of a P-type dopant through and around the thin sidewall spacer 45 to form the P-type doped, shallow source and drain extension junctions 48 and 50. The P-type doped, shallow source and drain extension junctions 48 and 50 after rapid thermal annealing are deeper than the N-type doped, shallow source and drain extension junctions 28 and 30. The sizing of the sidewall spacer 45 is used to displace the P-type doped, shallow source and drain extension junctions 48 and 50 from the polysilicon gate 16 to improve P-MOS short channel effect. A conventional photolithographic masking process is used to prevent ion implantation 47 of the partially completed NMOS device 43. This time a photoresist 46 is used and then is removed.

Figure 11:
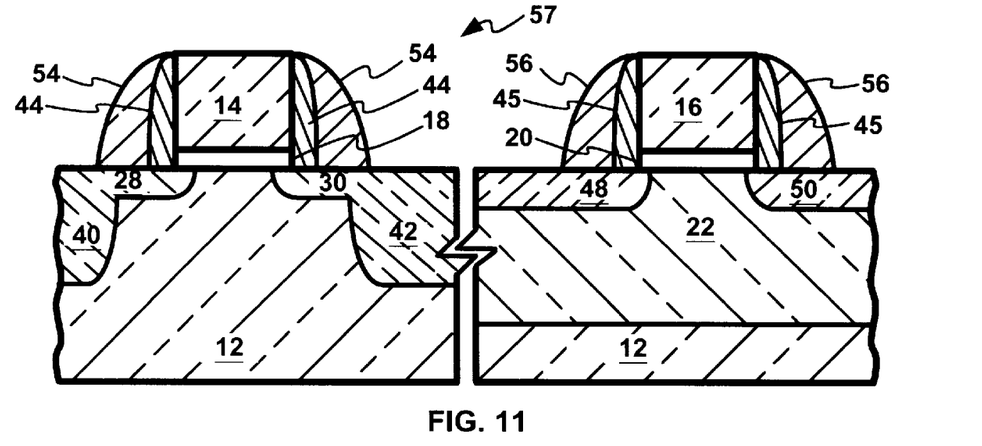
FIG. 11 is the cross-section of FIG. 10 with a second sidewall spacer formed on it.

Referring now to FIG. 11, therein are shown second sidewall spacers 54 and 56 formed over and around the thin sidewall spacers 44 and 45, respectively. It should be noted again that the composition of the thin sidewall spacers 44 and 45 and the second sidewall spacers 54 and 56 is different. Again, if one is an oxide spacer, the other will be a nitride spacer and vice versa. However, nitride is preferred for the second sidewall spacers 54 and 56 since it provides manufacturing advantages. With this step, the partially completed NMOS device 43 is a completed NMOS device 55.

Figure 12:
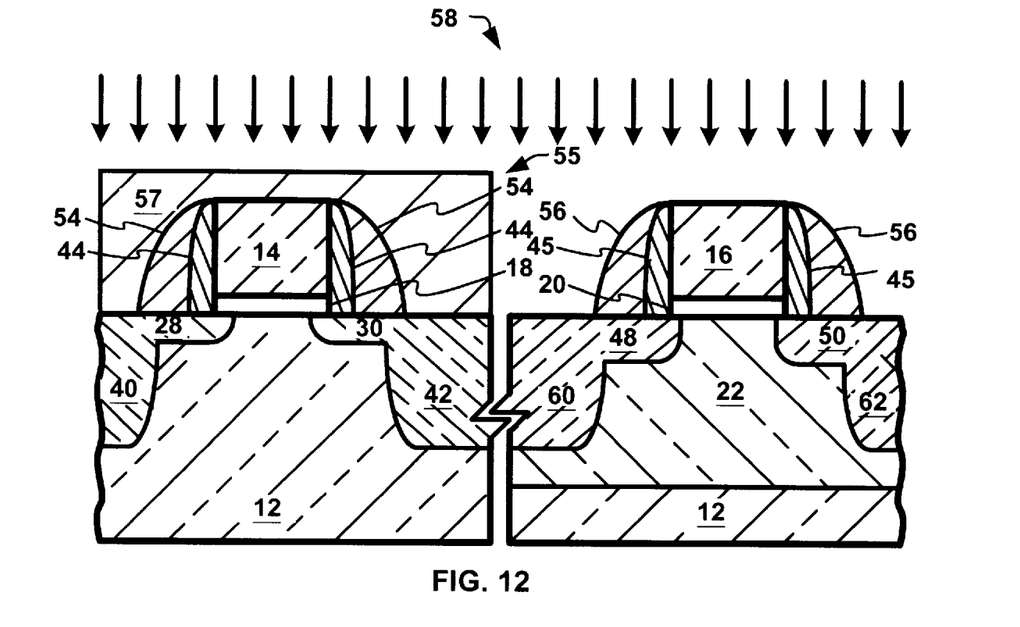
FIG. 12 is the cross-section of FIG. 11 during P-type dopant junction implantation.

Referring now to FIG. 12, therein is shown the ion implantation 58 of P-type dopant through and around the second sidewall spacer 56 to form the P-type doped, deep source and drain junctions 60 and 62. The thin sidewall spacer 44 and the second sidewall spacer 56 shield the shallow source and drain extension junctions 48 and 50 from the ion implantation 58. A conventional photolithographic masking process is used to prevent ion implantation 58 of the completed NMOS device 55. This time a photoresist 57 is used and then is removed.

Figure 13:
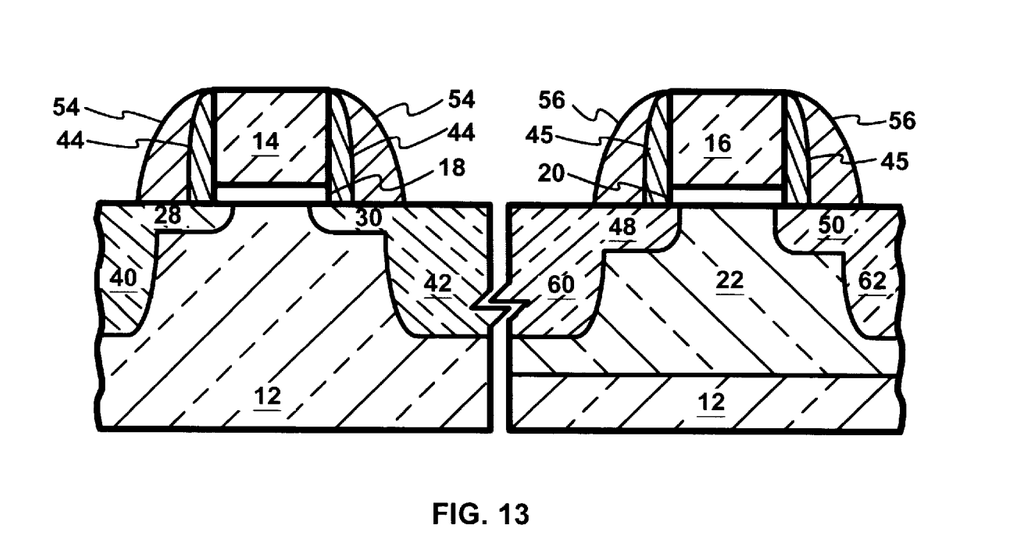
FIG. 13 is the cross-section of FIG. 12 after PMOS device rapid thermal anneal.

Referring now to FIG. 13, therein are shown the completed the completed NMOS device 55 and the completed PMOS device 63 after rapid thermal anneal of the P-type doped, deep source and drain junctions 60 and 62.

In manufacturing the CMOS devices of the present invention, conventional process steps are used to dope the silicon substrate 12 with P-type dopant and the N-well region 22 with N-type dopant. A conventional process is then used to lay down oxide on the silicon substrate 12 and then the polysilicon on top of the oxide. A conventional photolithographic masking process, which includes a polysilicon etch, produces the polysilicon gates 14 and 16 on top of the oxide which forms the gate oxides 18 and 20, respectively.

Subsequently, this processing may be followed by an optional polysilicon reoxidation step to form the very thin oxide 24 through which the implantation of the shallow source and drain extension junctions 28 and 30 may be performed.

After the optimal implantation of the shallow source and drain extension junctions 28 and 30, an oxide or a nitride spacer is formed. This first thin spacer 32, as shown in FIG. 4, is thicker than the very thin oxide 24.

Next, nitride or oxide sidewall spacers 34 and 36, as shown in FIG. 5, are formed adjacent to the polysilicon gates 14 and 16 on top of the thin spacer 32. It should be noted again that the composition of the first thin spacer 32 and the first sidewall spacers 34 and 36 is different. If one is an oxide spacer, the other will be a nitride spacer and vice versa. The reason for this is so that the etch used to remove the sidewall spacers 34 and 36 will not etch the thin spacer 32 and damage the substrate 12, the gates 14 and 16, or the gate oxides 18 and 20.

Following the formation of the first sidewall spacers 34 and 36, a N-type dopant is implanted by ion implantation 38 to form the deep source and drain junctions 40 and 42, as shown in FIG. 6. The first sidewall spacers 34 and 36 mask the shallow extension junctions 28 and 30 to prevent them from being deepened by the ion implantation 38. And the photoresist 39 masks the N-well region 22.

After ion implantation 38 of the deep source and drain junctions 40 and 42, the silicon substrate 12 is subject to an optimizing rapid thermal anneal at around 1050° C. for 10 seconds to activate the dopant, as shown in FIG. 7. It should be noted that this is a higher temperature rapid thermal anneal than used later for optimizing the PMOS device.

After the rapid thermal anneal in FIG. 7, the first sidewall spacers 34 and 36 are removed by a dry or wet etch process. As previously mentioned, the first thin spacer 32 which is of a different composition from the spacers 34 and 36 will not be subject to the same etch and will protect the substrate 12, the gates 14 and 16, and the gate oxides 18 and 20.

After the first sidewall spacers 34 and 36 are removed, the first thin spacer 32 is removed quickly because of its thinness with a short etch without harming the substrate 12, the gates 14 and 16, and the gate oxides 18 and 20. This leaves the partially completed NMOS device 43, as shown in FIG. 6, in which the source and drain junctions and extension junctions have been independently optimized as they are in the completed, optimized NMOS device 55.

As the first step in forming the optimized PMOS device 63, the thin sidewall spacers 44 and 45 are formed around the polysilicon gates 14 and 16 and the gate oxides 18 and 20, as shown in FIG. 10. Although the thin sidewall spacers 44 and 45 are formed, only the thin sidewall spacer 45 is used during the implantation 47. For most sub-micron devices, the thin sidewall spacer 45 is generally not required. However, for sub-100 nanometer devices, the shallow extension junctions 48 and 50 after rapid thermal annealing may not be shallow enough to produce a reasonable effective channel length between the extension junctions so the thin sidewall spacer 45 can be sized to optimize the displacement.

During the ion implantation 47, the partially completed NMOS device 43 is masked by the photoresist 46.

Next, nitride or oxide sidewall spacers 54 and 56, as shown in FIG. 11, are formed adjacent to the gates 14 and 16 on top of the thin sidewall spacers 44 and 45. It should be noted again that the composition of the thin sidewall spacers 44 and 45 and the second sidewall spacers 54 and 56 is different. Again, if one is an oxide spacer, the other will be a nitride spacer and vice versa.

Following the formation of the second sidewall spacers 54 and 56, a P-type dopant is implanted by ion implantation 58 to form the deep source and drain junctions 60 and 62, as shown in FIG. 12. The first sidewall spacers 54 and 56 mask the shallow extension junctions 48 and 50 to prevent them from being deepened by the ion implantation 58. And the photoresist 57 masks the completed NMOS device 55.

After ion implantation 58 of the source and drain junctions 60 and 62, the silicon substrate 12 is subject to an optimizing rapid thermal anneal at around 1000° C. for 10 seconds to activate the dopant, as shown in FIG. 13. It should be noted here that this annealing temperature is lower than that used for the NMOS device 55 which means that the NMOS device 55 will not be affected by this lower temperature rapid thermal anneal.

This process leaves the optimized NMOS and CMOS devices 42 and 62, respectively, which makeup the completed CMOS semiconductor 10.

As can be seen from the above, the present invention allows for independent control of the processing of both the NMOS and the PMOS source and drain structures so each can be independently optimized. The implantation displacements of the shallow extension junctions and of the deep junctions can be independently and accurately controlled. And, the NMOS device is exposed to the N-type dopant and higher temperature rapid thermal anneal (e.g. 1050° C. for 10 seconds) while the PMOS device is only exposed to the lower temperature rapid thermal anneal (e.g. 1000° C. for 10 seconds). By first using the higher temperature, N-type dopant rapid thermal anneal to first optimize and set the NMOS device, the lower temperature P-type dopant rapid thermal anneal can be used to optimize the PMOS device.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A method for manufacturing a semiconductor device after forming polysilicon gates and gate oxides over a semiconductor substrate, comprising the steps of:
- implanting first shallow extension junctions with a first dopant;
- forming first sidewall spacers on a first set of the polysilicon gates;
- implanting first deep junctions with said first dopant;
- rapid thermal annealing said first deep junctions whereby said first deep junctions are optimized;
- removing said first sidewall spacers from the first set of the polysilicon gates;
- forming thin sidewall spacers around a second set of the polysilicon gates;
- implanting second shallow extension junctions with a second dopant using said thin sidewall spacers;
- forming second sidewall spacers around the second set of the polysilicon gates;
- implanting second deep junctions with said second dopant; and
- rapid thermal annealing said second deep junctions whereby said second deep junctions are optimized independent of the optimization of said first deep junctions.

2. The method as claimed in claim 1 including the step of:
- forming thin sidewall spacers of a different composition from said second sidewall spacers before the step of forming said second sidewall spacers.

3. The method as claimed in claim 1 including the steps of:
- forming a thin spacer of a different composition from said first sidewall spacers before the step of forming said first sidewall spacers;
- forming thin sidewall spacers of a different composition from said second sidewall spacers before the step of forming said second sidewall spacers; and
- removing said thin spacer after implanting said first deep junctions.

4. The method as claimed in claim 1 including the step of:
- forming and adjusting the size of thin sidewall spacers before the step of implanting said second shallow extension junctions to control the displacements thereof.

5. The method as claimed in claim 4 including the steps of:
- masking portions of the semiconductor during said implanting steps.

6. The method as claimed in claim 1 including the steps of:
- forming a thin layer before the step of implanting said first shallow extension junctions to control the displacements thereof; and
- forming thin sidewall spacers before the step of implanting said second shallow extension junctions to control the displacements thereof.

7. The method as claimed in claim 6 including the step of:
- adjusting said thin layer before the step of implanting said first shallow extension junctions to control the displacements thereof; and
- adjusting said thin sidewall spacers independently from said adjusting said thin layer before the step of implanting said second shallow extension junctions to control the displacements thereof.

8. The method as claimed in claim I including the steps of:
- adjusting said rapid thermal annealing said first deep junctions to control the activation of said dopants therein; and
- adjusting said rapid thermal annealing said second deep junctions to control the activation of said dopants therein.

9. The method as claimed in claim 1 including the step of:
- forming a thin layer of a different composition from said first sidewall spacers over the polysilicon gates, gate oxides, and semiconductor substrate before the step of implanting first shallow extension junctions.

10. A method for manufacturing a semiconductor device after forming polysilicon gates and gate oxides over a doped semiconductor substrate, comprising the steps of:
- implanting first shallow extension junctions with a N-type dopant;
- forming first sidewall spacers on a first set of the polysilicon gates;
- implanting first deep junctions with said N-type dopant;
- rapid thermal annealing said first deep junctions whereby said first deep junctions are optimized;
- removing said first sidewall spacers from the polysilicon gates;
- forming thin sidewall spacers around a second set of the polysilicon gates;
- implanting second shallow extension junctions with a P-type dopant using said thin sidewall spacers;
- forming second sidewall spacers around the second set of the polysilicon gates;
- implanting second deep junctions with said P-type dopant; and
- rapid thermal annealing said second deep junctions whereby said second deep junctions are optimized independent of the optimization of said first deep junctions.

11. The method as claimed in claim 10 including the step of:
- forming thin sidewall spacers of an oxide before the step of forming said second sidewall spacers; and
- wherein said step of:
- forming said second sidewall spacers forms second sidewall spacers of a nitride.

12. The method as claimed in claim 10 wherein the steps of:
- forming the first sidewall spacers form sidewall spacers of a nitride; and
- forming the second sidewall spacers form sidewall spacers of a nitride; and including the steps of:
- forming a thin layer of an oxide before the step of forming said first sidewall spacers; and
- forming thin sidewall spacers of an oxide before the step of forming said second sidewall spacers.

13. The method as claimed in claim 10 including the steps of:
- forming a thin layer of an oxide before the step of forming said first sidewall spacers of a nitride;
- forming a thin spacer of an oxide on said thin layer of an oxide before the step of forming said second sidewall spacers of a nitride;
- removing said thin spacer after implanting said first deep junctions; and
- removing said thin layer after implanting said first deep junctions; and wherein the steps of:
removing said first sidewall spacers is selective and leaves said thin spacer; and
removing said first sidewall spacers is selective and leaves said thin layer.

14. The method as claimed in claim 10 including the steps of:
forming a thin layer of a nitride before the step of forming said first sidewall spacers of an oxide;
forming a thin spacer of a nitride before the step of forming said second sidewall spacers of an oxide;
removing said thin layer after implanting said first deep junctions; and
removing said thin spacer after implanting said first deep junctions; and
wherein the steps of:
removing said first sidewall spacers is selective and leaves said thin spacer; and
removing said first sidewall spacers is selective and leaves said thin layer.

15. The method as claimed in claim 10 including the step of:
forming and adjusting the thickness of a thin oxide before the step of implanting said shallow extension junctions to control the displacements thereof.

16. The method as claimed in claim 10 including the steps of:
masking first shallow extension junction distal gates before the step of implanting first shallow extension junctions;
masking first deep junction distal gates before the step of implanting first deep junctions;
masking second shallow extension junction distal gates before the step of implanting second shallow extension junctions; and
masking second deep junction distal gates before the step of implanting second deep junctions.

17. The method as claimed in claim 10 including the steps of:
forming and adjusting the thickness of a thin oxide before the step of implanting said first shallow extension junctions to set the displacement thereof; and
forming and sizing thin sidewall spacers before the step of implanting said second shallow extension junctions to set the displacement thereof.

18. The method as claimed in claim 10 wherein the steps of:
rapid thermal annealing of said first deep junctions is around 1050° C. for 10 seconds; and
rapid thermal annealing of said second deep junctions is around 1000° C. for 10 seconds.

19. A method for manufacturing a semiconductor device after forming polysilicon gates and gate oxides over a semiconductor substrate, comprising the steps of:
implanting first shallow extension junctions with a first dopant;
forming a thin spacer over the polysilicon gates, the gate oxides, and the semiconductor substrate;
forming first sidewall spacers of a different composition from said thin spacer on said thin spacer around a first set of the polysilicon gates;
implanting first deep junctions with said first dopant;
rapid thermal annealing said first deep junctions;
removing said first sidewall spacers selectively to leave said thin spacer;
removing said thin spacer without damaging the polysilicon gates, the gate oxides, and the semiconductor substrate;
forming thin sidewall spacers around a second set of the polysilicon gates;
implanting second shallow extension junctions with a second dopant using said thin sidewall spacers;
forming second sidewall spacers around the second set of the polysilicon gates;
implanting second deep junctions with said second dopant; and
rapid thermal annealing said second deep junctions at a lower temperature than said rapid thermal annealing of said first deep junctions.

20. The method as claimed in claim 19 including the steps of:
masking the polysilicon gates distal from said first shallow extension junctions with photoresist before implanting said first shallow extension junctions;
removing the photoresist from the polysilicon gates distal from said first shallow extension junctions before implanting said first shallow extension junctions;
masking the polysilicon gates distal from said first deep junctions with photoresist before implanting said first deep junctions;
removing the photoresist from the polysilicon gates distal from said first deep junctions before implanting said first deep junctions;
masking the polysilicon gates distal from said second shallow extension junctions with photoresist before implanting said second shallow extension junctions;
removing the photoresist from the polysilicon gates distal from said second shallow extension junctions before implanting said second shallow extension junctions;
masking the polysilicon gates distal from said second deep junctions with photoresist before implanting said second deep junctions; and
removing the photoresist from the polysilicon gates distal from said second deep junctions before implanting said second deep junctions.

* * * * *